United States Patent [19]
Miyachi et al.

[11] Patent Number: 5,248,348
[45] Date of Patent: Sep. 28, 1993

[54] AMORPHOUS SILICON SOLAR CELL AND METHOD FOR MANUFACTURING THE SAME

[75] Inventors: Kenji Miyachi; Masato Koyama; Yoshinori Ashida; Nobuhiro Fukuda, all of Yokohama, Japan

[73] Assignee: Mitsui Toatsu Chemicals, Incorporated, Tokyo, Japan

[21] Appl. No.: 756,219

[22] Filed: Sep. 5, 1991

[30] Foreign Application Priority Data

Sep. 6, 1990 [JP] Japan ................ 2-234391
Sep. 6, 1990 [JP] Japan ................ 2-234392
Sep. 6, 1990 [JP] Japan ................ 2-234393

[51] Int. Cl.$^5$ .................. H01L 31/075; H01L 31/18
[52] U.S. Cl. .......................... 136/258; 437/4; 437/108; 437/109
[58] Field of Search .... 136/258 AM; 437/4, 108–109; 428/620; 148/33, 33.2; 357/2, 30 J, 30 K

[56] References Cited

U.S. PATENT DOCUMENTS

| | | | |
|---|---|---|---|
| 4,379,943 | 4/1983 | Yang et al. | 136/249 TJ |
| 4,471,155 | 9/1984 | Mohr et al. | 136/258 |
| 4,690,830 | 9/1987 | Dickson et al. | 427/583 |
| 4,968,384 | 1/1990 | Asano | 156/643 |
| 5,114,498 | 5/1992 | Okamoto et al. | 136/258 AM |

FOREIGN PATENT DOCUMENTS

| | | | |
|---|---|---|---|
| 2604561 | 9/1987 | France | 136/258 AM |
| 59-107574 | 6/1984 | Japan | 136/258 AM |
| 62-177983 | 8/1987 | Japan | 136/258 AM |

OTHER PUBLICATIONS

A. Asano et al, J. Appl. Phys., vol. 65, pp. 2439-2444 (1989).
K. Takahashi et al "Amorphous Silicon Solar Cells", J. Wiley and Sons, New York (1986), pp. 114 and 118.
English abstract—JP 63,014,420, Jan. 21, 1988.
English abstract—JP 2,155,225, Jun. 14, 1990.
"Preparation of highly photoconductive hydrogenated amorphous silicon carbide films with a multiplasma--zone apparatus", J. of Applied Physics, (1989) 15 Mar., No. 6, pp. 2439-2444.
"Preparation of a-Si:H films by alternately repeating deposition and hydrogen plasma treatment." Tech. Digest of the Int'l PVSEC-5, Japan, 1990, pp. 63-66.

Primary Examiner—Aaron Weisstuch
Attorney, Agent, or Firm—Millen, White, Zelano & Branigan

[57] ABSTRACT

A method for preparing an amorphous silicon solar cell is disclosed which comprises forming on a substrate, in the following order, a first electrode, a first conductive film, a thin first substantially intrinsic film, a thicker second substantially intrinsic film, a second conductive film and a second electrode.
the method being characterized in that at least the thicker second substantially intrinsic film is formed by the sequential steps of:
(a) depositing a semiconductor film containing 20 atom % or less of bound hydrogen and/or bound deuterium to a thickness of from 5 to 1000 Å, and then (b) modifying the deposited film, the sequence of steps being repeated multiple times.

The solar cell formed by the above-mentioned method is particularly excellent in long-term stability.

27 Claims, 3 Drawing Sheets

AMORPHOUS SILICON SOLAR CELL AND METHOD FOR MANUFACTURING THE SAME

BACKGROUND OF THE INVENTION (i) Field of the Invention

The present invention relates to an amorphous silicon solar cell, and more specifically, it relates to a manufacturing technique of an amorphous silicon solar cell having stable, excellent photovoltaic characteristics.

(ii) Description of the Prior Art

Amorphous silicon solar cells have already been utilized as low-output energy sources for driving portable calculators and watches. However, amorphous silicon solar cells are not sufficient in performance and stability as an energy source having a large output of 0.1W. Accordingly, various investigations have been made to improve the performance. In fact, the performance is slightly improved by altering the structure, as in the case of a tandem type solar cell. When such solar cell has been actually used for one year, its photovoltaic characteristics usually deteriorate about 20%.

SUMMARY OF THE INVENTION

The present inventors have considered that the deterioration of photovoltaic characteristics is due to the properties of the hydrogenated amorphous silicon film itself which is formed in accordance with the usual film formation methods such as plasma CVD, photo CVD or thermal CVD, and they have conducted investigations. As a result, it has been found that for a film having a narrower optical band gap than a conventional film, good photoelectric properties and improved stability to light soaking can be obtained by first depositing an amorphous silicon film containing a lesser amount of hydrogen, creating the thus deposited film with a non-film-depositing reactive gas such as hydrogen, hydrogen fluoride, fluorine, nitrogen trifluoride, or carbon tetrafluoride in a modification step, and then repeating these two steps.

An object of the present invention is to provide a method for forming a further improved amorphous silicon film. Another object of the present invention is to provide an amorphous silicon solar cell having excellent photovoltaic performance and stability which can be obtained by applying the above-mentioned film formation method to the formation of a substantially intrinsic silicon film.

According to the first aspect of the present invention, there is provided a method for preparing an amorphous silicon solar cell having stable, excellent photovoltaic properties which comprises forming, in this order on a substrate, a first electrode, a first conductive film, a thin first substantially intrinsic film, a thicker second substantially intrinsic film, a second conductive film, and a second electrode, the aforesaid method being characterized in that at least the thicker second substantially intrinsic film is formed by the sequential steps of:

(a) depositing a semiconductor film containing 20 atom % or less of bound hydrogen and/or deuterium to a thickness of 5 to 1000 Å, and then (b) modifying the deposited film, the sequence of steps being repeated multiple times.

According to the second aspect of the present invention, there is provided a method for preparing an amorphous silicon solar cell having stable, excellent photovoltaic properties, which comprises forming, in this order on a substrate, a first electrode, a first conductive film, a thin first substantially intrinsic film, a thicker second substantially intrinsic film, a second conductive film, and a second electrode, the aforesaid method being characterized in that at least the thicker second substantially intrinsic film is formed by the sequential steps of:

(a) depositing a silicon semiconductor film having a thickness of from 1 to 100 Å, and then (b) modifying the deposited film by subjecting it to dehydrohalogenation, the sequence of steps being repeated multiple times.

DETAILED DESCRIPTION OF THE INVENTION

The constitution of an amorphous silicon solar cell which can be manufactured by the present invention will be described with reference to FIG. 2. The solar cell which can be manufactured by the present invention comprises a substrate 1, a first electrode 2, a first conductive film 3, a thin first substantially intrinsic film 4, a thicker second substantially intrinsic film 5, a second conductive film 7, and a second electrode 8 which are stacked on the substrate 1.

Figure 1:
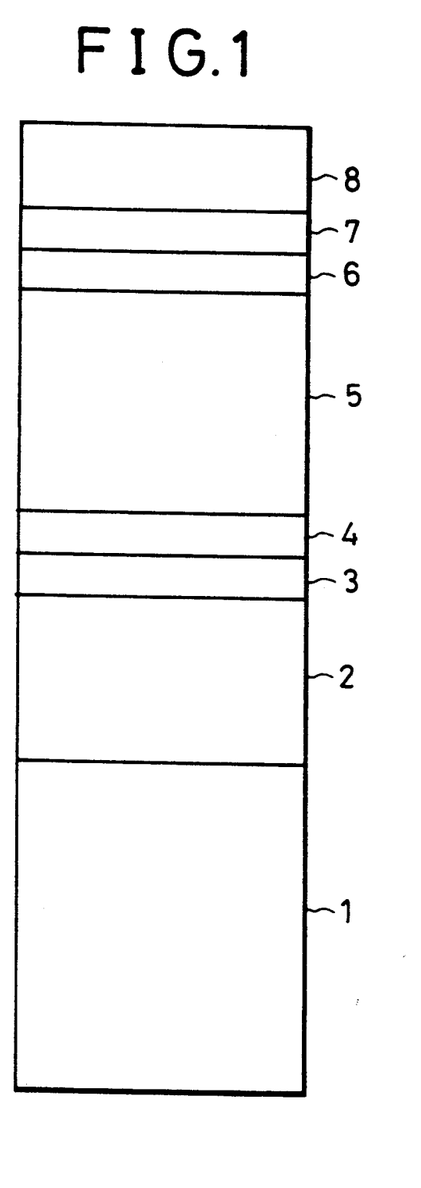
FIGS. 1 and 2 are schematic views illustrating layered structure of amorphous silicon solar cells obtained in examples of the present invention.

More preferably, as shown in FIG. 1, a thin third substantially intrinsic film 6 may be interposed between the thicker second substantially intrinsic film 5 and the second conductive film 7.

No particular restriction is put on the thickness of the respective layers constituting the solar cell, but the thickness of the thick second substantially intrinsic film must be larger than that of a film formed by one cycle of film deposition and modification as described hereinafter, and each of the other films has the same thickness as in a usual amorphous solar cell.

That is, with regard to the thickness of the respective films, in general, the thickness of the first electrode 2 is from 1000 Å to 5 μm, that of the first conductive film 3 is from 10 to 500 Å, that of the thin first substantially intrinsic film 4 is from 10 to 500 Å, that of the thicker second substantially intrinsic film 5 is from 500 Å to 2 μm, that of the thin third substantially intrinsic film 6 is from 10 to 500 Å, that of the second conductive film 7 is from 10 to 500 Å, and that of the second electrode 8 is from 1000 Å to 5 μm. No particular restriction is put on the materials of the substrate and electrode which can be used in the present invention, and conventional materials can be effectively used. For example, the material of the substrate may have insulating or conductive properties, transparency or opaqueness. Fundamentally, as the material of the substrate, there can be effectively used a film or a plate of glass, alumina, silicon, stainless steel, aluminum, molybdenum, chromium, or a heat-resistant polymer. The material of the electrodes is not substantially restricted except that the electrode on the light-incident side must be transparent or have at least some transparency. Thus, as the material of the electrodes, there can be suitably selected and used a metal such as aluminum, silver, chromium, titanium, nickel-chromium, gold or platinum, or a metal oxide of tin oxide, zinc oxide or indium oxide.

In this invention, the term "amorphous silicon solar cell" includes an amorphous silicon cell, amorphous silicon-germanium alloy cell, amorphous silicon-carbon cell, and amorphous silicon-tin alloy cell.

In the present invention, the electrodes, conductive films and substantially intrinsic films are formed on the substrate, but only the formation process of the intrinsic film and conductive film which is the feature of the present invention will be described in detail.

The present invention is characterized by forming the second substantially intrinsic film by repeating a film deposition step and a modification step. The other films, i.e., the first conductive film, the thin first substantially intrinsic film, the thin third substantially intrinsic film, and the second conductive film can also be formed by repeating the above-mentioned film deposition step and the modification step without impairing the effect of the present invention, and this procedure is rather preferable. Next, detailed reference will be made to the method of film formation by repeating the film deposition step and the modification step.

In the present invention, no particular restriction is put on the film deposition step. Typical techniques of the film formation include physical film deposition methods such as vacuum evaporation, sputtering, and ion plating, as well as chemical vapor deposition (CVD) methods such as photo CVD and plasma CVD.

The modification step is a step in which discharge is allowed to occur in a non-deposition gas containing a reactive gas, and the film deposited in the above-mentioned film deposition step is exposed to the discharge atmosphere; the film is exposed to monovalent ions; or the film is exposed to atomic hydrogen or atomic deuterium to improve the characteristics of the film.

Furthermore, the modification step can also be achieved by subjecting the film to dehydrohalogenation, and this modification step will be described hereinafter.

In the present invention, the film deposition step and the modification step are repeated, but in the film deposition step, the semiconductor film which is deposited contains 20 atom % or less of bound hydrogen and/or bound deuterium. "20 atom % or less of bound hydrogen and/or bound deuterium" means that if only bound hydrogen is present, the amount of bound hydrogen is 20 atom % or less, that if only bound deuterium is present, the amount of bound deuterium is 20 atom % or less, or that if both bound hydrogen and bound deuterium are present, the total amount of bound hydrogen and bound deuterium is 20 atom % or less.

The thickness of the semiconductor film deposited by one cycle of the steps is from 5 to 1000 Å, preferably from 5 to 100 Å, more preferably from 10 to 80 Å, most preferably from 30 to 50 Å.

In the film deposition step, it is not always necessary to make constant the thickness of the semiconductor film deposited by one cycle. The present inventors suggest that the optical band gap can be changed by regulating the thickness of the semiconductor film deposited in one cycle. That is, it is preferable to continuously change the optical band gap by regulating the thickness of the second substantially intrinsic film in a certain cycle.

No particular restriction is put on the film deposition conditions other than the above-mentioned requirement.

The film deposition method is preferably a physical film deposition method or a chemical vapor deposition (CND) method.

The physical film deposition method will be described as follows.

Examples of the physical film deposition method include vacuum evaporation, sputtering, and ion plating.

In the first place, in the case where a substantially intrinsic film is formed, there can be effectively used an element, a compound, or an alloy such as silicon, silicon carbide, silicon nitride, silicon-germanium alloy (or composite powder) or silicon-tin alloy (or composite powder), as the starting material. No particular restriction is put on the conditions for the film deposition except that the amount of the bound hydrogen and/or bound deuterium is controlled within the range determined in the present invention. The conditions for the film deposition can be selected so that bound hydrogen and/or bound deuterium may be present in the semiconductor film in an amount of 20 atom % or less, preferably 10 atom % or less, and at least 1 atom %. When the amount of bound hydrogen and/or bound deuterium is in excess of 20 atom %, the effect of exposing the film to the discharge atmosphere containing a reactive gas is not perceived. Needless to say, the film deposition can be carried out in an atmosphere of an inert gas, hydrogen, deuterium, a hydrocarbon, fluorine, oxygen or the like, so long as the above-mentioned conditions are met. With regard to specific conditions, the gas flow rate is from 1 to 100 sccm, and the reaction pressure is in the range of from 0.001 mtorr to 10 torr. Depending upon the desired deposition rate, film deposition conditions such as the flow rate, pressure, electric power, and the like can be suitably selected. Substrate temperature is not basically restricted, and it is preferably set in compliance with the modification step. Typically, it is selected in the range of from room temperature to 500° C.

Next, an embodiment of the film deposition step in accordance with the CVD method will be described.

In the first place, in the case of substantially intrinsic film formation, as a raw material gas, there can be used a silane compound such as monosilane, disilane, trisilane or tetrasilane represented by the formula $Si_nH_{2n+2}$, $Si_nD_{2n+2}$ or $Si_nD_{(2n+2)-m}H_m$ (each of n and m is an integer), silane fluoride, an organic silane, a hydrocarbon, a germanium compound, or germanium fluoride. Furthermore, a gas such as ammonia, hydrogen, deuterium, fluorine, chlorine, helium, argon, neon or nitrogen may be used together with the raw material gas. This gas can be effectively used in an amount of from 0.01 to 100% (volume ratio) based on the raw material gas, and this amount of the gas is suitably selected, based upon the desired deposition rate and characteristics of the film (the hydrogen content and the like).

Also in the film deposition method by CVD, no particular restriction is put on the film deposition conditions except that the amount of bound hydrogen and/or bound deuterium is decreased. That is, the film deposition conditions are selected so that the amount of bound hydrogen and/or bound deuterium in the semiconductor film is 20 atom % or less, preferably 10 atom % or less. When the amount of bound hydrogen and/or bound deuterium is in excess of 20 atom %, the properties are very poor, so that the object of the present invention cannot be achieved. The typical conditions will be described below. In the photo CVD method, an ultraviolet light source having a wave length of 350 nm or less such as a low-pressure mercury lamp, a deuterium lamp or a rare gas lamp can be used to decompose the raw material gas, so that the film is deposited. As preferable film deposition conditions, the gas flow rate is from 1 to 100 sccm, and reaction pressure is from 15 mtorr to atmospheric pressure. Substrate temperature is preferably from 200 to 600° C., and in particular, it is suitably selected in the range of from 300° to 500° C., considering the film formation time which can be presumed from the heat resistance of the substrate and the deposition rate, the temperature of the modification step, and the like.

Next, the plasma CVD method will be described in detail.

As a discharge system, there can be effectively used a radio-frequency discharge system, a direct current discharge system, a microwave discharge system, or an ECR discharge system. Preferably, the flow rate of the raw material gas is from 1 to 900 sccm, reaction pressure is from 0.001 mtorr to atmospheric pressure, and electric power is from 1 mW/cm$^2$ to 10W/cm$^2$. These film deposition conditions can be suitably changed in accordance with the desired deposition rate and the selected discharge system. Substrate temperature is preferably from 200° to 600° C., more preferably from 300° to 500° C.

In the present invention, the substantially intrinsic film deposited in the above-mentioned film deposition step is modified in the modification step.

The modification step can be achieved by (a) exposing the film to a discharge atmosphere containing a non-film-depositing reactive gas, (b) exposing the film to monovalent ions, or (c) exposing the film to atomic hydrogen or atomic deuterium.

(a) The step of exposing the film to a discharge atmosphere containing a non-film-depositing reactive gas will now be described in detail:

In this step, the non-film-depositing reactive gas is first introduced into the modification chamber, and discharge is allowed to occur. The film deposited in the film formation step is then exposed to the resultant discharge atmosphere.

Examples of the discharge system include a radiofrequency discharge system, a direct current discharge system, a microwave discharge system, and an ECR discharge system. Examples of the non-film-depositing reactive gas include hydrogen, deuterium, and fluorine compounds, and hydrogen, deuterium, or hydrogen fluoride can be effectively used. In addition, there can also be used mixtures of these gases, and mixtures of the above-mentioned gases with fluorine, nitrogen trifluoride, and carbon tetrafluoride. With regard to the typical discharge conditions for the modification step, it is preferred that the discharge power is from 1 to 500W, the flow rate of the non-film-depositing reactive gas is from 5 to 500 sccm, and the pressure is from 0.001 mtorr to atmospheric pressure. The discharge is started and then maintained under these conditions. The substrate temperature is preferably maintained at the same level as in the film deposition step or at a lower level, and is from room temperature to 600° C., preferably from 200° to 500° C.

(b) The step of exposing the film to monovalent ions will now be described in detail:

In this modification step, the non-film-depositing reactive gas is introduced into a modification chamber, and a discharge is initiated and the film is exposed to the discharge atmosphere. Simultaneously, bias voltage is applied to the substrate on which the film is deposited, and the film is exposed to the ionized plasma components. Here, the term monovalent ions means monovalent anions or cations of hydrogen, deuterium, fluorine, chlorine or the like.

The discharge can be effectively achieved by utilizing radio-frequency, direct current, microwave, or ECR discharge. Furthermore, another useful method is one in which ions are generated by means of an ion generator and then led onto the surface of the film. Specifically, an ion generator such as a Kaufmann type ion gun or an ECR ion gun is used. The non-film-depositing reactive gas is hydrogen, deuterium, fluorine, a fluorine compound or the like, and examples of the non-film-depositing reactive gas which can be effectively used in the present invention include hydrogen, deuterium, a hydrogen fluoride, deuterium fluoride, fluorine, nitrogen trifluoride, and carbon tetrafluoride. In addition, a mixture of these gases can also effectively be used. The typical conditions of the modification step are as follows. In the case where a discharge is used, it is preferred that the discharge power is from 1 to 500W, the flow rate of the non-film-depositing reactive gas is from 5 to 500 sccm, and the pressure is from 0.001 mtorr to atmospheric pressure. Under these conditions, the discharge is initiated and then maintained. In the case where an ion gun is used, the flow rate of the non-film-depositing reactive gas is from 1 to 50 sccm, and the pressure is 0.001 mtorr to 10 mtorr. Under these conditions, the ions are generated and then maintained for a long period of time. Furthermore, ion energy is preferably from 10 to 2000 eV, more preferably from 50 to 700 eV. When the ion energy is in excess of 2000 eV, damage to the film by the ions and a sputtering phenomenon are noticeable instead of the desired beneficial effects of the modification. The substrate temperature is preferably maintained at the same level as in the film deposition step or at a lower level, and it is from room temperature to 600° C., preferably from 200° to 500° C.

(c) The step of exposing the film to atomic hydrogen or atomic deuterium will now be explained in detail:

In this modification step, atomic hydrogen or deuterium is generated in the modification chamber, or it is generated in an atomic hydrogen generator connected to the modification chamber, and then introduced into the modification chamber. Next, the film deposited on the substrate is exposed to the atomic hydrogen or atomic deuterium to modify the film. In order to generate atomic hydrogen or atomic deuterium, radio-frequency, direct current, microwave, or ECR discharge can be effectively utilized. In particular, the microwave or the ECR discharge can generate atomic hydrogen or atomic deuterium at a high concentration, and therefore it is preferable to use this system as the atomic hydrogen or atomic deuterium generating means. Also, atomic hydrogen or atomic deuterium can be generated by a hot filament. In this case, atomic hydrogen or atomic deuterium can be effectively fed to the surface of the film by disposing the hot filament in the vicinity of the film surface in the modification chamber. The discharge is preferably initiated and then maintained at a discharge power of from 1 to 500W at a flow rate of hydrogen or deuterium diluted with an inert gas of from 1 to 500 sccm under a pressure of from 0.001 mtorr to atmospheric pressure. In the case where the hot filament is used, atomic hydrogen or atomic deuterium can easily be generated by, for example, heating a tungsten filament to 1400°–2000° C. in a hydrogen or deuterium atmosphere. Preferably, the flow rate of hydrogen or deuterium, or hydrogen or deuterium diluted with an inert gas, is from 1 to 500 sccm and the pressure is from 0.001 to 500 torr. The substrate temperature is preferably maintained at the same level as in the film deposition step or at a lower level, and it is from room temperature to 600° C., preferably from 200° to 500° C.

In the present invention, the film deposition step and the modification step are repeated as described above, whereby the modified films are stacked and a predetermined thickness is attained.

In the present invention, a film having a thickness of from 5 to 1000 Å, preferably from 5 to 100 Å, more preferably from 10 to 80 Å, and most preferably from 30 to 50 Å, can be deposited in one film deposition step. No particular restriction is put on the total thickness of the film, but the total thickness of the film is preferably from about 500 Å to about 10 $\mu$m, more preferably from about 1000 Å to about 2 $\mu$m. No particular restriction is put on the time necessary for one cycle (which is one film deposition step and one modification step), but it is 1000 seconds or less. It is preferred that the transfer time from the film deposition step to the modification step and the transfer time from the modification step back to the film deposition step are as short as possible. These transfer times depend upon the shape and size of the apparatus, vacuum evacuation system, and the like. In particular, each transfer time can be regulated to 30 seconds or less, or in a certain case, 1 second or less.

In the present invention, the thinner first substantially intrinsic film and the thinner third substantially intrinsic film are disposed on and under the thicker second substantially intrinsic film, and this structure tends to smoothly connect otherwise abrupt changes and deviations of material compositions and energy levels between the conductive films and the thicker second substantially intrinsic film. In the case where the first conductive film is a p-type film and the second conductive film is an n-type film, the above-mentioned larger structure can be achieved by gradually decreasing the feed of a dopant gas such as diborane (p-type dopant) from a specific value to zero, when the first substantially intrinsic film is formed thereon. Furthermore, the above-mentioned structure can also be achieved by gradually increasing the flow rate of a dopant gas such as phosphine (n-type dopant) from zero to a specific value, when the third substantially intrinsic film is formed.

Therefore, the substrate temperature, pressure and gas flow rate, etc. are selected in accordance with the deposition conditions of the first and second conductive films and the thicker second substantially intrinsic film.

The thinner substantially intrinsic films effectively inhibit the diffusion of elements from the adjacent conductive film substance at the time of the formation of the thicker second substantially intrinsic film. Furthermore, in the case where the thicker second substantially intrinsic film is very different from the second conductive film in composition and the like, for example, in a typical case such as where the thicker second substantially intrinsic film is a SiGe:H alloy film and the first and second conductive films are Si:H or SiC:H alloy films, the thinner third substantially intrinsic film is inserted without fail, as shown in FIG. 1. However, in the case where the composition of the thicker second substantially intrinsic film is nearly the same as the second conductive film, there is no problem if the thinner third substantially intrinsic film is not provided, as shown in FIG. 2.

Fundamentally, an amorphous silicon solar cell obtained by forming the first electrode, the first conductive film, the substantially intrinsic film, the second conductive film, and the second electrode on the substrate in this order is considered to be equivalent and thus it is also included in the scope of the present invention.

Next, the formation of the conductive film will be described.

The formation of the conductive film is nearly identical with that of the above-mentioned substantially intrinsic film, and a physical film deposition method or a CVD method can be used.

In the case where the conductive films are formed, the first conductive film and the second conductive film have opposite conductivity types. For example, if the first conductivity type is p-type, the second conductivity type is n-type. Needless to say, its converse is also possible. In order to give p-type conductivity to the film, a compound containing a Group III element (e.g., boron) is used as the starting material, or the film deposition is carried out in an atmosphere containing a diborane, a boron halide, a trimethylboron gas, or the like. In order to give n-type conductivity to the film, a compound containing a Group V element (e.g., phosphorus) is used as the starting material, or the film deposition is carried out in an atmosphere containing phosphine, arsine, a phosphorus halide, an arsenic halide, an alkylphosphorus, an alkylarsenic gas, or the like. With regard to specific film deposition conitions, it is preferred that the gas flow rate is from 1 to 100 sccm and the reaction pressure is in the range of from 0.001 mtorr to 10 torr. Furthermore, the conditions of the gas flow rate, the pressure and electric power can be suitably selected in accordance with the deposition rate. No particular restriction is put on film formation temperature, but usually it is selected in the range of from room temperature to 500° C.

On the other hand, in the case where the conductive films are formed by the CVD method, the first conductive film and the second conductive film have opposite conductivity types, as in the physical deposition method. For example, if the first conductivity type is p-type, the second conductivity type is n-type. Needless to say, its converse is also possible. In order to give p-type conductivity to the conductive film, the film formation is carried out by adding diborane, a boron halide, trimethylboron or the like to the raw material gas. In order to give n-type conductivity to the film, the film formation is carried out by adding phosphine, arsine, a phosphorus halide, an arsenic halide, an alkylphosphorus, an alkylarsenic gas or the like to the raw material gas.

In this case, the conditions of gas flow rate, reaction pressure, electric power and substrate temperature are identical with the film formation conditions for the substantially intrinsic film which are described above.

In the formation method of the thicker substantially intrinsic film of the present invention, the deposited silicon semiconductor film is modified by subjecting the same to dehydrohalogenation. In this case, if the silicon semiconductor film is a halogenated silicon semiconductor film, this dehydrohalogenation is carried out by bringing the halogenated silicon semiconductor film into contact with a silicon hydride gas or a silicon deuteride gas.

On the other hand, if the silicon semiconductor film is a hydrogenated silicon semiconductor film or a deuterated silicon semiconductor film (not containing any halogen), the dehydrohalogenation is carried out by bringing the hydrogenated silicon semiconductor film or the deuterated silicon semiconductor film into contact with a silicon halide gas. In either case, the dehydrohalogenation is carried out in an atmosphere of a silicon hydride gas, a silicon deuteride gas or a silicon halide gas. In this case, the dehydrohalogenation may be performed, while the film is irradiated with light.

First, the method of using silicon hydride gas or silicon deuteride gas will be described. The halogenated silicon semiconductor film is formed by a physical film deposition technique such as vacuum evaporation, sputtering or ion plating, or by a chemical vapor deposition (CVD) technique such as photo CVD or plasma CVD.

The dehydrohalogenation step is achieved by introducing silicon hydride or silicon deuteride, while the surface of the film is covered with halogen atoms, and then applying light, heat, ions or the like to the film to bring about a dehydrohalogenation reaction and to thereby bind the silicon atoms of silicon hydride to the film.

In this connection, the halogenated semiconductor film of the present invention may contain hydrogen.

The method of the invention is characterized by repeating the film deposition step and the dehydrohalogenation step, and the thickness of the semiconductor film deposited during each cycle is preferably regulated to from 1 Å to 100 Å. Other than this requirement, film deposition conditions do not have any influence on the effect of the present invention.

As the film deposition method, a physical film deposition method will now be described.

Examples of the starting material for film deposition which can be effectively used in the physical film deposition method include elements, compounds, and alloys thereof such as silicon, silicon carbide, silicon nitride, silicon-germanium alloy (or composite powder) and silicon-tin alloy (or composite powder). A reactive film deposition method which can be carried out in an atmosphere of fluorine, chlorine, or the like is convenient. Furthermore, after the film deposition, a film not containing halogen can be subjected to a halogen treatment to obtain a halogenated silicon. A substrate temperature of 500° C. or less can be employed under conditions such that the surface of the deposited film can be covered with the halogen atoms. The film deposition may be carried out in an atmosphere of an inert gas, a hydrocarbon, oxygen, or the like. With regard to typical conditions, the gas flow rate is from 1 to 100 sccm, and the reaction pressure is in the range of from 0.001 mtorr to 10 torr. Furthermore, the film deposition conditions, e.g. the flow rate, the pressure, electric power and the like can be suitably selected in accordance with the desired deposition rate. The substrate temperature is preferably set in accordance with the dehydrohalogenation step, but basically no restriction is put on this temperature. Typically, a temperature of 500° C. or less is selected.

A typical embodiment of the CVD method which is effective to deposit the film will now be described.

Examples of the raw material gas include a gas mixture of a silane compound such as a monosilane, a disilane, a trisilane or a tetrasilane represented by the formula $Si_nH_{2n+2}$, $Si_nD_{2n+2}$ or $Si_nD_{(2n+2)-m}H_m$ (each of n and m is an integer) and a halogen gas such as chlorine or fluorine; a halogenated silane such as monofluorosilane, difluorosilane, trifluorosilane, tetrafluorosilane, monochlorosilane, dichlorosilane or trichlorosilane; a gas mixture of this halogenated silane and hydrogen or deuterium; and a gas mixture of the above-mentioned gas and an organic silane, a hydrocarbon or the like. In addition, hydrogen, deuterium, helium, argon, neon, nitrogen or the like may be introduced together with the raw material gas. When this kind of gas is used, its effective amount is in the range of from 0.01 to 100% (volume ratio) based on the raw material gas, and it is suitably selected based upon the desired deposition rate and film characteristics (the amount of hydrogen and the like).

No particular restriction is put on film deposition conditions, as in the case of the physical film deposition method. The specific conditions will be described below.

In the case of the photo CVD, an ultraviolet light source having a wave length of 350 nm or less, such as a low-pressure mercury lamp, a deuterium lamp, or a rare gas lamp, is used to decompose the raw material gas, so that the film is deposited. With regard to the film deposition conditions, the gas flow rate is preferably from 1 to 100 sccm, and the reaction pressure is preferably from 15 mtorr to atmospheric pressure. Substrate temperature is preferably from room temperature to 600° C., and more preferably, it is suitably selected in the range of from 300° to 500° C., based upon the film formation time which can be presumed from the heat resistance of the substrate and the deposition rate, the temperature in the dehydrohalogenation step and the like.

In the case of the plasma CVD, as a discharge system, there can be effectively used a radio-frequency, a direct current, a microwave, or an ECR discharge system. Preferably, the flow rate of the raw material gas is from 1 to 900 sccm, reaction pressure is from 0.001 mtorr to atmospheric pressure, and electric power is from 1 $mW/cm^2$ to $10W/cm^2$. These film deposition conditions can be suitably changed in accordance with the deposition rate and the discharge system. Substrate temperature is preferably from room temperature to 600° C., more preferably from 300° to 500° C.

In the present invention, the dehydrohalogenation step of the deposited semiconductor film can be effected by introducing a silane compound into a dehydrohalogenation chamber, and then applying heat, light, ions or the like to the film. In the case where heat is used, the substrate temperature is from 400° to 600°, preferably from 400° to 500° C. In the case of light or ion irradiation, the substrate temperature is from room temperature to 600°, preferably from 200° to 450° C., which are lower temperatures than in the case of only applying heat.

Examples of effectively usable silane compounds include silicon hydrides and silicon deuterides such as monosilane, disilane, and trisilane.

It is particularly preferable that the dehydrohalogenation reaction is carried out by light irradiation. As is apparent from the foregoing, the dehydrohalogenation reaction is carried out by irradiating the surface of the halogenated silicon film with light in an atmosphere of a silicon hydride gas. Substrate temperature is from room temperature to 600° C., preferably from 200° to 450° C. Reaction pressure is in the range of from 1 mtorr to 1 torr, more preferably from 10 mtorr to 100 mtorr. In order to effectively achieve the dehydrohalogenation reaction, the light source is suitably selected from a low-pressure mercury lamp, a rare gas discharge lamp, an ultraviolet laser, a deuterium lamp, an Xe pulse lamp, a visual laser, a carbon dioxide gas laser or the like.

The dehydrohalogenation reaction in the present invention is particularly effective when conducted under a low pressure, and radiation other than ultraviolet can also be effectively utilized. Therefore, it should be noted that the present invention is different from conventional photo CVD. Furthermore, irradiation time can be suitably selected in according to the desired deposition rate of the film.

Preferably, a film having a thickness of from 1 to 100 Å is formed by one operation of the film deposition step. The film thickness achieved in the film deposition step can be controlled by regulating the film formation time. The deposition rate is from about 0.1 to about 30 Å/second, and therefore, for example, the film formation time is from about 3 seconds to about 1000 seconds. When the film thickness is in excess of 100 Å, the effect of the subsequent dehydrohalogenation step is impaired. Conversely, when a film having an extremely small thickness, e.g., a thickness of less than 1 Å is deposited by one operation of the film formation step, the effect of the present invention is not impaired but deposition must be repeated several thousand times to obtain a desired total film thickness. The time necessary for one cycle is not a requirement which is particularly restricted, but it is preferably 1000 seconds or less. It is preferred that the transfer time from the film deposition step to the dehydrohalogenation step and the transfer time from the dehydrohalogenation step to the film deposition step are as short as possible. No particular restriction is put on the total thickness of the film formed by repeating the film deposition step and the dehydrohalogenation step, but it is generally from about 500 Å to about 2 μm. The transfer times depend upon the shape and size of the apparatus, the vacuum evacuation system, and the like. In particular, each transfer time can be regulated to 30 seconds or less.

In the preferred embodiment of the present invention, the silicon films are formed by repeating, for every one to several atomic layers, the step of covering of the surface of the deposited film with a halogen and the step of dehydrohalogenation with silicon hydride or silicon deuteride. The thus obtained silicon film contains less microvoids and has high density.

Next, reference will be made to a method of using a silicon halide gas. A hydrogenated silicon or a deuterated silicon semiconductor film can typically be formed by a physical film deposition method such as vacuum evaporation, sputtering or ion plating, or by a chemical vapor deposition (CVD) method such as photo CVD or plasma CVD. Furthermore, the dehydrohalogenation step is achieved by introducing a silicon halide, while the surface of the film is covered with hydrogen or deuterium and simultaneously applying light, heat, ions or the like to the film to perform a dehydrohalogenation reaction and to thereby bind the silicon atoms of the silicon halide to the film.

The present invention is characterized by repeating the film deposition step and the dehydrohalogenation step, and the thickness of the semiconductor film formed each repetition cycle is preferably regulated to 1-100 Å. Film deposition conditions other than this requirement do not have any influence on the effect of the present invention.

An effective physical film deposition method will now be described.

Examples of the starting material for the physical film deposition include elements, compounds, and alloys such as silicon, silicon carbide, silicon nitride, silicon-germanium alloy (or composite powder) and silicon-tin alloy (or composite powder). A reactive film deposition method in an atmosphere of hydrogen or deuterium is convenient, and after the film formation, the film can be subjected to a hydrogen treatment or a deuterium treatment to obtain a hydrogenated or a deuterated semiconductor film. Preferably, a film deposition temperature of 500° C. or less can be employed under conditions such that the surface of the deposited film is covered with hydrogen or deuterium.

The film deposition may be carried out in an atmosphere of an inert gas, hydrogen, deuterium, a hydrocarbon, fluorine, oxygen, or the like without disturbing the object of the present invention. With regard to specific conditions, the gas flow rate is from 1 to 100 sccm, and the reaction pressure is in the range of from 0.001 mtorr to 10 torr. Furthermore, the film deposition conditions such as the gas flow rate, the pressure, electric power and the like can be suitably selected in accordance with the deposition rate. The substrate temperature is preferably set in accordance with the dehydrohalogenation step, but basically no restriction is put on this temperature. Typically, a temperature of 500° C. or less is selected.

An embodiment of the effective CVD method will now be described.

As the raw material gas for the film formation, there can be used a silane compound such as monosilane, disilane, trisilane, or tetrasilane represented by the formula $Si_nH_{2n+2}$, $Si_nD_{2n+2}$ or $Si_nD_{(2n+2)-m}H_m$ (each of n and m is an integer), silane fluoride, an organic silane, a hydrocarbon, germanium hydride or germanium fluoride, singly or in the form of a mixture thereof. In addition, hydrogen, deuterium, fluorine, chlorine, helium, argon, neon, nitrogen or the like may be introduced together with the raw material gas. When this kind of gas is used, its effective amount is in the range of from 0.01 to 100% (volume ratio) of the raw material gas, and it is suitably selected based upon the deposition rate and film characteristics (the amount of hydrogen and the like).

No particular restriction is put on the film deposition conditions, as in the case of the physical film deposition method. Specific conditions are as follows.

In the case of photo CVD, an ultraviolet light source having a wave length of 350 nm or less, such as a low-pressure mercury lamp, a deuterium lamp, or a rare gas lamp is used to decompose the raw material gas, whereby the film is deposited. As preferable film deposition conditions, the gas flow rate is from 1 to 100 sccm, reaction pressure is from 15 mtorr to atmospheric pressure, and substrate temperature is from room temperature to 600° C. More preferably, the substrate temperature is suitably selected in the range of from 300° to 500° C., based upon the film formation time which can be presumed from the heat resistance of the substrate and the deposition rate, the temperature in the dehydrohalogenation step, and the like.

In the case of plasma CVD, as a discharge system, there can be effectively used a radio-frequency, a direct current, a microwave, or an ECR discharge system. Preferably, the flow rate of the raw material gas is from 1 to 900 sccm, reaction pressure is from 0.001 mtorr to atmospheric pressure, and electric power is from 1 mW/cm² to 10W/cm². These film deposition conditions can be suitably changed in accordance with the deposition rate and the discharge system. The substrate temperature is preferably from room temperature to 600° C., more preferably from 300° to 500° C.

In the present invention, the dehydrohalogenation step of the deposited semiconductor film can be effected by introducing a silicon halide into a dehydrohalogenation chamber, and then applying heat, light, ions, or the like to the film. In the case where heat is used, the substrate temperature is from 400° to 600°, preferably from 400° to 500° C. In the case of light or ion irradiation, the substrate temperature is from room temperature to 600°, preferably from 200° to 450° C., which are lower temperatures than in the case where heat is used. It is preferable to use heat, light, and ions together. In order to effectively conduct the dehydrohalogenation reaction, it is preferable to lower the pressure in the dehydrohalogenation chamber. That is, the reaction pressure is in the range of from 1 mtorr to 1 torr, more preferably from 10 mtorr to 100 mtorr.

In the case where the dehydrohalogenation reaction is carried out under light irradiation, the reaction conditions are substantially the same as in the case of using the above-mentioned silicon hydride gas.

The silicon halide which can be used in the dehydrohalogenation step is a compound obtained by replacing hydrogen of silicon hydride (hereinafter referred to simply as "silane") with a halogen atom, and examples of the silicon halide include silane halides, disilane halides and trisilane halides. Examples of effective halogens include fluorine, chlorine, and bromine. Typical examples of the silicon halide include monofluorosilane, difluorosilane, trifluorosilane, monochlorosilane, dichlorosilane, trichlorosilane, monofluorodisilane, difluorodisilane, monochlorodisilane, and dichlorodisilane.

Preferably, one operation of the film deposition step provides a film having a thickness of from 1 to 100 Å. Deposition of a film having a thickness of 100 Å or less can be controlled by regulating the film formation time. Thus, since the deposition rate is from about 0.1 to about 30 Å/second, the film formation time is, for example, from about 3 seconds to 1000 seconds. When the film thickness is in excess of 100 Å, the effect of the subsequent dehydrohalogenation step is impaired. Conversely, when a film having an extremely small thickness, e.g., a thickness of less than 1 Å is formed by one operation of the film deposition, deposition must be repeated several thousand times to obtain a predetermined total film thickness, though the effect of the present invention is not impaired. The time necessary for one cycle is not particularly restricted, but it is preferably 1000 seconds or less. It is preferred that the transfer time from the film deposition step to the dehydrohalogenation step and the transfer time from the dehydrohalogenation step to the film deposition step are as short as possible. These transfer times depend upon the shape and size of the apparatus, the vacuum evacuation system, and the like. In particular, each transfer time can be shortened to 30 seconds or less. The film deposition step and the dehydrohalogenation step may be performed in the same reaction chamber or in separate chambers without impairing the effect of the present invention. No particular restriction is put on the thickness of the film formed by repeating the film deposition step and the dehydrohalogenation step, but it is usually from about 10 Å to about 10 μm.

In the preferred embodiment of the present invention, the silicon films are formed by repeating for every one to several atomic layers, the step of covering of the surface of deposited film with hydrogen and the step of dehydrohalogenation with a silicon halide. The thus obtained silicon film contains much less microvoids and has high density.

Figure 2:
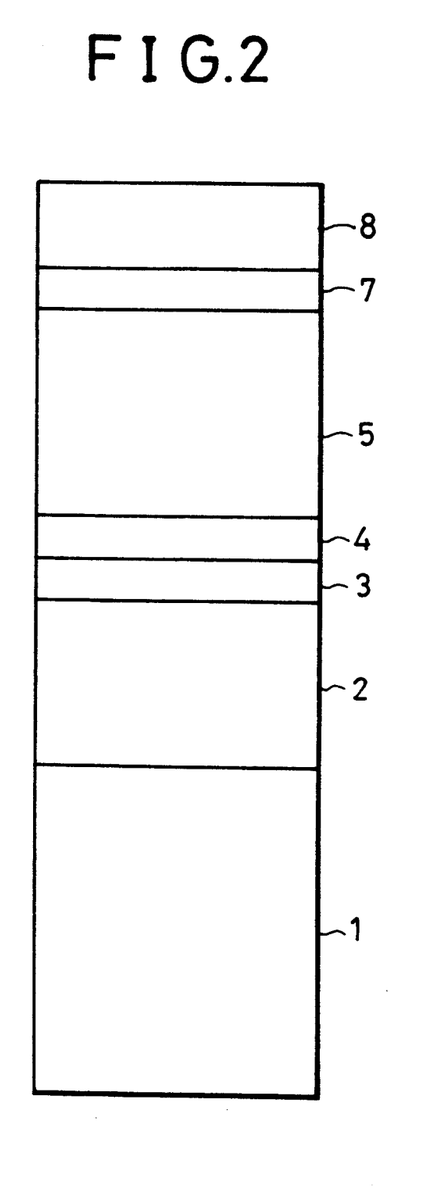

FIGS. 1 and 2 show schematic diagrams of layered structure amorphous silicon solar cells obtained by the present invention. In FIG. 1, reference numeral 1 is a substrate, numeral 2 is a first electrode, 3 is a first conductive film, 4 is a thin first substantially intrinsic film, 5 is a thicker second substantially intrinsic film, 6 is a thin third substantially intrinsic film, 7 is a second conductive film, and 8 is the second electrode.

In FIG. 2, reference numeral 1 is the substrate, numeral 2 is the first electrode, 3 is the first conductive film, 4 is the thin first substantially intrinsic film, 5 is the thicker second substantially intrinsic film, 7 is the second conductive film, and 8 is the second electrode.

Figure 3:
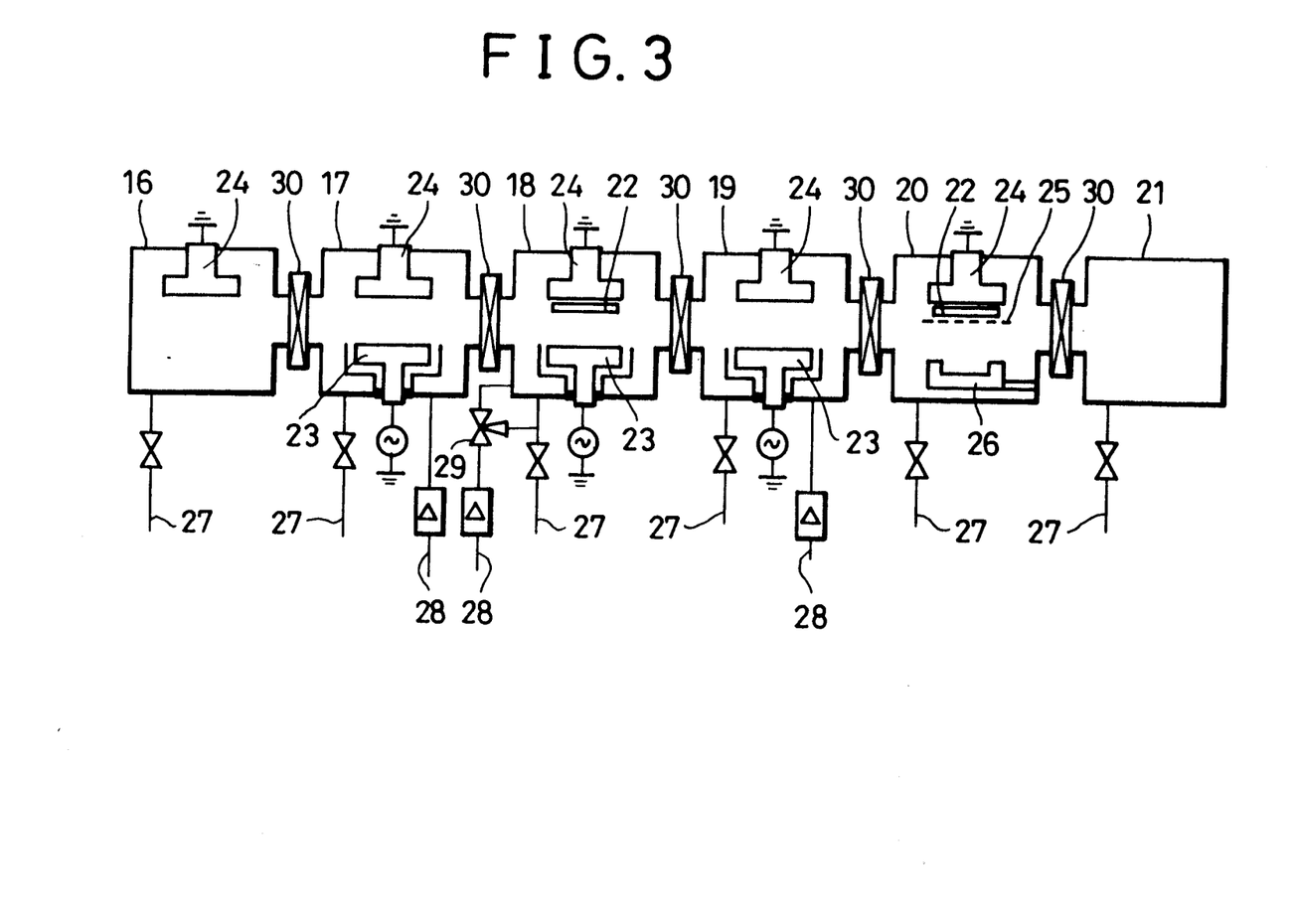
FIGS. 3 and 4 are constitutional views illustrating exemplary apparatus for manufacturing the solar cells of the present invention.

FIG. 3 is a schematic view illustrating one embodiment of a preferred apparatus for preparing a solar cell of the present invention. Here, reference numeral 16 is a substrate loading chamber, numeral 17 is a first conductive film formation chamber, 18 is a thick second substantially intrinsic film formation chamber, 19 is a second conductive film formation chamber, 20 is a second electrode formation chamber, 21 is a substrate unloading chamber, 22 is a substrate, 23 is a radio-frequency electrode, 24 is a substrate heating electrode, 25 is a metal mask, 26 is an evaporation source, 27 is a vacuum evacuation line, 28 is a raw material gas introduction line, 29 is a three-way valve, and 30 is a gate valve.

Figure 4:
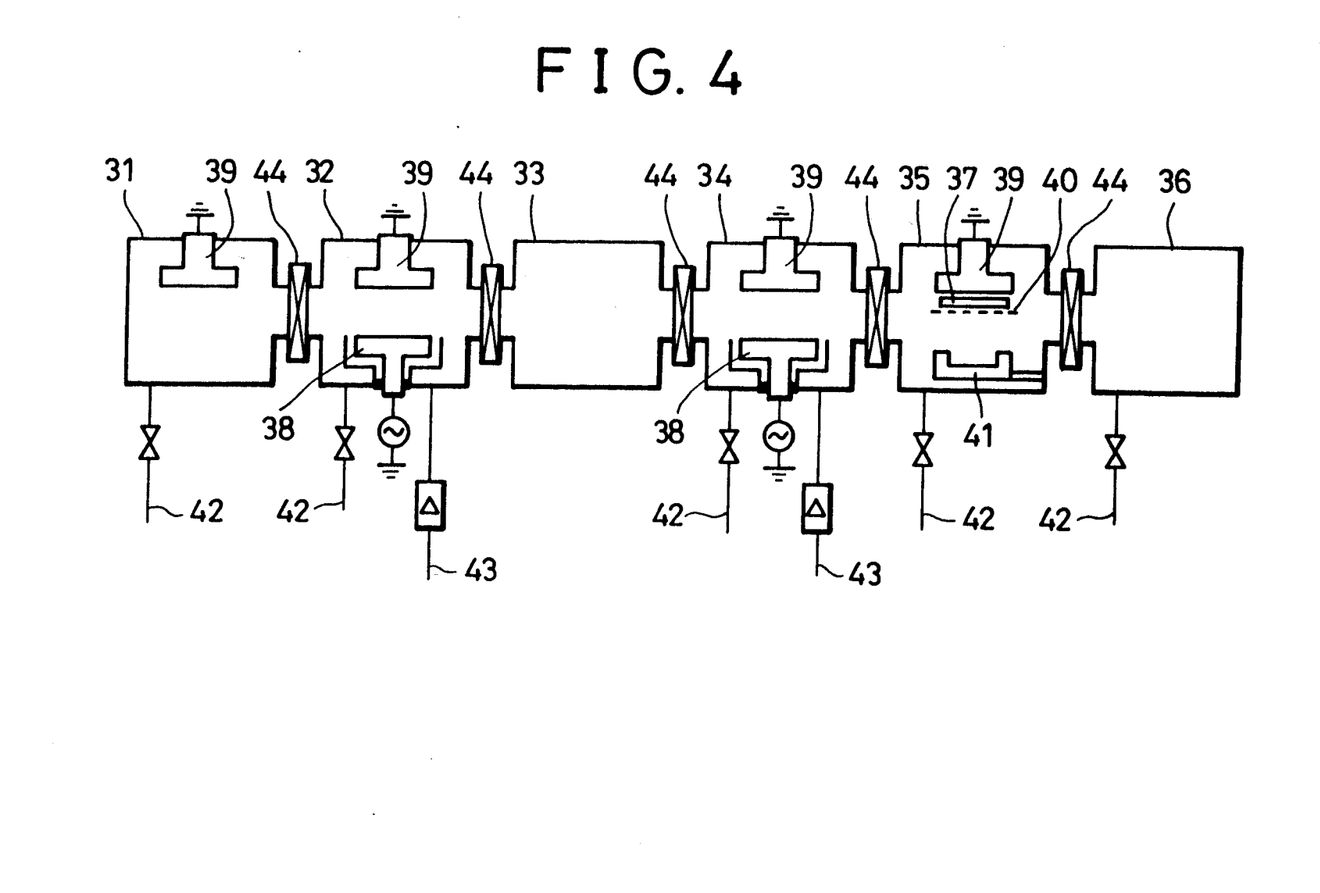

FIG. 4 shows a schematic view illustrating another embodiment of a preferred apparatus for preparing the solar cell of the present invention. In FIG. 4, reference numeral 31 is a substrate loading chamber, numeral 32 is a first conductive film formation chamber, 33 is a thick second substantially intrinsic film formation chamber, 34 is a second conductive film formation chamber, 35 is a second electrode formation chamber, 36 is a substrate unloading chamber, 37 is a substrate, 38 is a radio-frequency electrode, 39 is a substrate heating electrode, 40 is a metal mask, 41 is an evaporation source, 42 is a vacuum evacuation line, 43 is a raw material gas introduction line, and 44 is a gate valve.

The sectional schematic views illustrating examples of layered structure of the amorphous silicon solar cells manufactured by the above-mentioned method are shown in FIGS. 1 and 2. The first and second conductive types are different from each other, and if one is p-type, the other is n-type. Furthermore, the materials of the first and second electrodes depend upon the transparency of the substrate and the direction of light-incidence. For example, if a transparent glass substrate is used and light is incident from the glass side, tin oxide or the like which is a transparent conductive film must be applied to the substrate as the first electrode. On the other hand, when light is incident from the second electrode side, the first electrode may be made of a metal such as silver or aluminum, but the second electrode must be a transparent conductive film.

FIGS. 3 and 4 show schematic views illustrating preferred apparatus for forming the elements of the present invention. The respective chambers are separated by gate valves, and the substrate can be delivered to the respective chambers without breaking vacuum by mechanisms for opening and closing these valves and substrate delivery mechanisms. Each of the first and second conductive film formation chambers 17, 19 in the FIG. 3 embodiment is capable of performing a usual plasma CVD method. The employment of the conductive film formation chambers 17, 19 permits forming the thin first substantially intrinsic film and the thin third substantially intrinsic film.

The second electrode formation chamber 20 has the function of vacuum evaporation or sputtering by which the second electrode can be formed. In FIG. 3, the thick second substantially intrinsic film formation chamber 18 which is the feature of the present invention has the function of performing the usual plasma CVD method and includes a gas feed switching device capable of switching the feed of raw material gases. In the FIG. 4 embodiment, the thick second substantially intrinsic film formation chamber 33 is further divided into two chambers, i.e. an exclusive film deposition chamber and an exclusive modification chamber. The combination of these two chambers can be selected from the group consisting of vacuum evaporation, sputtering, ion plating, photo CVD, plasma CVD and the like. This embodiment is disclosed in detail in U.S. patent application Ser. No. 07/545,176 and EPO Publication No. 407088A1 (incorporated herein by reference).

EXAMPLE 1

An apparatus as shown in FIG. 3 was employed. This apparatus comprises a substrate loading chamber, a first conductive film formation chamber, a thick second substantially intrinsic film formation chamber, a second conductive film formation chamber, and a second electrode formation chamber, and in all the chambers except the substrate loading chamber and the electrode formation chamber, a plasma CVD method could be applied. The layered structure of an amorphous silicon solar cell which could be obtained herein is shown in FIG. 2. As the first electrode 2, a glass substrate 1 on which a tin oxide film was formed was heated in vacuum in the substrate loading chamber and then transferred to the first conductive film formation chamber. In order to provide a first conductive film 3 with p-type conductivity, a raw material gas comprising disilane/-dimethylsilane/diborane/hydrogen=5/1.5/0.01/20 (by volume) was introduced, and p-type amorphous silicon carbide film 3 having a thickness of about 100 Å was formed under conditions of a pressure of 0.2 Torr, a substrate temperature of 250° C., and a radio-frequency electric power of 1W. Next, the feed of diborane was stopped. And then, by gradually decreasing the ratio of dimethylsilane/disilane from 1/5 to 0 a thin first substantially intrinsic film 4 having a thickness of about 150 Å was formed under a pressure of 0.1 Torr at a substrate temperature of 275° C. at a radio-frequency electric power of 1W. Afterward, the substrate was delivered to the thicker second substantially intrinsic film formation chamber. A thicker second substantially intrinsic film 5 was formed by the following procedure. First, a Si film having a thickness of about 40 Å was formed by the use of 2 sccm of disilane and 50 sccm of hydrogen under a reaction pressure of 0.25 Torr at a radio-frequency electric power of 15W at a substrate temperature of 300° C. Next, discharge was not interrupted but the feed of disilane was immediately stopped, and the Si film was exposed to a discharge atmosphere by the use of 50 sccm hydrogen as a reactive gas for 10 seconds under conditions of a pressure of 0.25 Torr, a radio-frequency electric power of 15W and a substrate temperature of 400° C. After modification, 2 sccm of disilane was introduced again, and the film deposition step and the modification step were repeated under the same conditions. The cycle was repeated 150 times to form a film having a thickness of about 6000 Å. Next, the thus formed film was transferred to the second conductive film formation chamber. In order to give n-type conductivity to the film, a raw material gas comprising disilane/phosphine/hydrogen=10/0.01/100 was introduced, and an n-type microcrystalline silicon film having a thickness of about 500 Å was formed thereon at a substrate temperature of 250° C. under a pressure of 0.2 Torr at a RF electric power of 80W. Next, the film was transferred to the second electrode formation chamber, and an aluminum film was formed thereon as a second electrode 8 by vacuum evaporation.

The photovoltaic conversion properties of the thus obtained amorphous silicon solar cell were measured under irradiation of AM-1.5 and 100 mW/cm$^2$ by means of a solar simulator. The photovoltaic conversion efficiency was 12.8%, short-circuit current was 18.70 mA/cm$^2$, open circuit voltage was 0.900V, and fill factor was 0.760, which meant that the solar cell had excellent performance. In addition, for the purpose of determining the light stability of the above-mentioned amorphous silicon solar cell, it was continuously irradiated with light of AM-1.5 and 100 mW/cm$^2$ for 20 hours to observe the change of the photovoltaic conversion efficiency. The decrease of the photovoltaic conversion efficiency after 20 hours with respect to the initial photovoltaic conversion efficiency was 5% or less, which meant that the above-mentioned amorphous silicon solar cell was excellent in stability.

COMPARATIVE EXAMPLE 1

An amorphous silicon solar cell was formed as in Example 1, except that a thicker second substantially intrinsic film having a thickness of 6000 Å was formed without performing the modification step after the deposition step. With regard to the performance of the thus obtained amorphous silicon solar cell, the photovoltaic conversion efficiency was 11.7%, short-circuit current was 17.15 mA/cm$^2$, open circuit voltage was 0.911V, and fill factor was 0.752, which meant that the solar cell in this comparative example was poorer in performance than the cell in Example 1. Furthermore, the light-stability of the cell was measured under the same conditions as in Example 1, and as a result, the decrease of the photovoltaic conversion efficiency was about 20%, which meant that the cell lacked light stability. The results of this comparative example indicate that the effect of the present invention cannot be sufficiently obtained, if the thick second substantially intrinsic layer does not receive the modification step.

EXAMPLE 2

The same procedure as in Example 1 was effected except that in the film formation step of the thicker second substantially intrinsic film hydrogen was replaced with deuterium.

The photovoltaic conversion properties of the thus obtained amorphous silicon solar cell were measured under irradiation of AM-1.5 and 100 mW/cm$^2$ by means of a solar simulator. The photovoltaic conversion efficiency was 13.0%, short-circuit current was 18.87 mA/cm$^2$, open circuit voltage was 0.902V, and fill factor was 0.766, which meant that the solar cell had excellent performance. In addition, for the purpose of inspecting the light-stability of the above-mentioned amorphous silicon solar cell, it was continuously irradiated with light of AM-1.5 and 100 mW/cm$^2$ for 20 hours to observe the change of the photovoltaic conversion efficiency. The decrease of the photovoltaic conversion efficiency after 20 hours with respect to an initial photovoltaic conversion efficiency was 1% or less, which meant that the above-mentioned amorphous silicon solar cell was an extremely stable photovoltaic conversion device.

COMPARATIVE EXAMPLE 2

An amorphous silicon solar cell was formed as in Example II, except that a thicker second substantially intrinsic film having a thickness of 6000 Å was formed without performing the modification step after the deposition step. With regard to the performance of the thus obtained photovoltaic conversion device, the photovoltaic conversion efficiency was 11.9%, short-circuit current was 17.27 mA/cm$^2$, open circuit voltage was 0.910V, and fill factor was 0.756, which meant that the solar cell in this comparative example was poorer in performance than the cell in Example 2. Furthermore, the light-stability of the cell was measured, and as a result, the decrease of the photovoltaic conversion efficiency was about 10%, which meant that the light-stability is a little better than in the case of the usual cell in which deuterium was not used, but its reliability is insufficient. The results of this comparative example indicate that the effect of the present invention cannot be sufficiently obtained, if the thick second substantially intrinsic layer does not receive the modification step.

EXAMPLE 3

A cell was formed as in Example 1, except that the chemical vapor deposition method for forming the thicker second substantially intrinsic film was replaced with a physical film deposition method (sputtering method) using the apparatus shown in FIG. 4. That is, a substrate on which a first substantially intrinsic film was formed in the same manner as in Example 1 was then transferred to a thicker second substantially intrinsic film formation chamber. This thicker second substantially intrinsic film deposition chamber was composed of two chambers, a film deposition chamber and a modification chamber. In the film deposition chamber, a high-purity silicon target was used as a cathode, and 10 sccm of argon gas was introduced into the film deposition chamber. The substrate temperature was 300° C., and a Si film having a thickness of 40 Å was formed by applying a radio-frequency electric power of 100W under a pressure of 0.6 mtorr in the film deposition chamber, and the thus deposited film was then transferred to the modification chamber. In this modification chamber, a radio-frequency electric power of 50W was applied to the electrode in an atmosphere of hydrogen gas of 100 sccm under a pressure of 0.2 torr to bring about radio-frequency discharge, and the film was exposed to the discharge for 10 seconds. The substrate which had undergone the modification step was returned to the film deposition chamber, and the cyclic operation of film deposition step-film modification step was repeated under the same conditions. The cyclic operation was repeated 150 times to obtain a film thickness of about 6000 Å, and the substrate having this film thereon was transferred to a second conductive film formation chamber. Then, film formation as in Example 1 was carried out.

The photovoltaic conversion properties of the thus obtained amorphous silicon solar cell were measured under the condition of AM-1.5 and 100 mW/cm$^2$ by means of a solar simulator. The photovoltaic conversion efficiency was 12.6%, short-circuit current was 18.69 mA/cm$^2$, open circuit voltage was 0.890V, and fill factor was 0.757, which meant that the solar cell had excellent performance. In addition, for the purpose of inspecting the light-stability of the above-mentioned amorphous silicon solar cell, it was continuously irradiated with light of AM-1.5 and 100 mW/cm$^2$ for 20 hours to observe the change of the photoelectric conversion efficiency. The decrease of the photoelectric conversion efficiency after 20 hours with respect to the initial photovoltaic conversion efficiency was 3% or less, which meant that the above-mentioned amorphous silicon solar cell was excellent in stability.

COMPARATIVE EXAMPLE 3

An amorphous silicon solar cell was formed as in Example 3 except that a thicker, second substantially intrinsic film having a film thickness of 6000 Å was formed without performring the modification step. With regard to the performance of the thus obtained amorphous silicon solar cell, the photovoltaic conversion efficiency was 10.9%, short-circuit current was 17.67 mA/cm$^2$, open circuit voltage was 0.892V, and fill factor was 0.692, which meant that the solar cell in this comparative example was poorer in performance than the cell in Example 3. Furthermore, the light-stability of the cell was measured under the same conditions, and as a result, the decrease of the photovoltaic conversion efficiency after light irradiation for 20 hours was about 27%, which meant that the light-stability was insufficient.

EXAMPLE 4

A cell was formed as in Example 3, except that exposing the thicker second substantially intrinsic film to a discharge atmosphere in the modification step was replaced with exposing the film to monovalent ions. That is, an apparatus using a modification chamber having an ion gun instead of discharge means was utilized. 20 sccm of hydrogen was introduced into the modification chamber, and hydrogen ions were caused to collide with the film for 10 seconds under a pressure of 0.8 mtorr with an ion energy of 500 eV, whereby the surface of the film was treated.

With regard to the characteristics of the thus obtained amorphous silicon solar cell, the photovoltaic conversion efficiency was 12.3%, short-circuit current was 18.14 mA/cm$^2$, open circuit voltage was 0.892V, and fill factor was 0.762, which meant that the solar cell was excellent in performance. After light irradiation for 20 hours, the decrease of the photovoltaic conversion efficiency with respect to the initial photovoltaic conversion efficiency was extremely small, about 2%, which meant that the amorphous silicon solar cell was excellent in stability.

EXAMPLE 5

A cell was formed as in Example 3, except that exposing the thicker second substantially intrinsic film film to a discharge atmosphere in the modification step was replaced with exposing the film to atomic hydrogen. That is, in a discharging chamber, a microwave-frequency electric power of 200W was applied thereto by the use of 10 sccm of hydrogen under a pressure of 0.1 torr to effect microwave discharge, and atomic hydrogen produced thereby was introduced into the modification chamber and the surface of the Si film was then exposed to atomic hydrogen for 10 seconds.

With regard to the characteristics of the thus obtained amorphous silicon solar cell, the photovoltaic conversion efficiency was 12.5%, short-circuit current was 18.34 mA/cm$^2$, open circuit voltage was 0.902V, and fill factor was 0.756, which meant that the solar cell was excellent in performance. After light irradiation for 20 hours, the decrease of the photovoltaic conversion efficiency was extremely low, about 2%, which meant that the amorphous silicon solar cell was excellent in stability.

EXAMPLE 6

A cell was formed as in Example 1, except that the thicker, second substantially intrinsic film was formed by repeating film deposition and modification by dehydrohalogenation. That is, a substrate on which a thin first substantially intrinsic film was formed in the same manner as in Example 1 was transferred to a thicker second substantially intrinsic film formation chamber. This thicker second substantially intrinsic film formation chamber was composed of two chambers, a film deposition chamber and a dehydrohalogenation chamber. The temperature of the substrate was set to 300° C., and 10 sccm of a mixed gas of trichlorosilane and hydrogen was introduced as a raw material. A Si film of about 40 Å thickness was deposited under a pressure of 0.008 torr in the film deposition chamber by the application of a radio-frequency electric power of 10W and then transferred to the dehydrohalogenation chamber. Disilane was introduced into the dehydrohalogenation chamber, and the chlorinated and hydrogenated silicon film was exposed to ultraviolet rays from an ultraviolet lamp under a pressure of 0.1 torr for 30 seconds. The substrate having the film thereon was returned to the film deposition chamber, and the cyclic operation of the film deposition step and the dehydrohalogenation step was repeated 150 times to obtain a total thickness of about 6000 Å. Afterward, the substrate having the thus formed film was transferred to a second conductive film formation chamber, and the same film formation as in Example 1 was carried out.

The photovoltaic conversion properties of the thus obtained amorphous silicon solar cell were measured under the irradiation of AM-1.5 and 100 mW/cm$^2$ by means of a solar simulator. As a result, the photovoltaic conversion efficiency was 12.7%, short-circuit current was 18.49 mA/cm$^2$, open circuit voltage was 0.895V, and fill factor was 0.767, which meant that the solar cell had excellent performance. In addition, for the purpose of inspecting the light-stability of the above-mentioned amorphous silicon solar cell, it was continuously irradiated with light of AM-1.5 and 100 mW/cm$^2$ for 20 hours to observe the change of the photovoltaic conversion efficiency. The decrease of the photovoltaic conversion efficiency after 20 hours with respect to the initial photovoltaic conversion efficiency was 1% or less, which meant that the above-mentioned amorphous silicon solar cell was excellent in stability.

COMPARATIVE EXAMPLE 4

A cell was formed as in Example 6, except that a halogenated Si film of a thickness of 6000 Å was made without performing a dehydrohalogenation step. With regard to the performance of the thus obtained amorphous silicon solar cell, the photovoltaic conversion efficiency was 11.0%, short-circuit current was 17.85 mA/cm$^2$, open circuit voltage was 0.890V, and fill factor was 0.692, which meant that the solar cell in this comparative example was poorer in performance than the cell in Example 6. Furthermore, the light-stability of the cell was measured, and as a result, the decrease of the photovoltaic conversion efficiency after light irradiation for 20 hours was about 23%, which meant that the light-stability was insufficient.

EXAMPLE 7

A cell was formed as in Example 1, except that the thicker second substantially intrinsic film was formed by repeating film deposition and modification by dehydrohalogenation. That is, a substrate on which a thin first substantially intrinsic film was formed in the same manner as in Example 1 was then transferred to a thicker second substantially intrinsic film formation chamber. This thicker second substantially intrinsic film formation chamber was composed of two chambers, a film deposition chamber and a dehydrohalogenation chamber. The temperature of the substrate was set to 300° C., and a high-purity silicon target was used as a cathode, and 10 sccm of a mixed gas of argon and hydrogen was introduced into the film deposition chamber. A Si film having a thickness of about 40 Å was deposited by applying a radio-frequency electric power of 100W under a pressure of 0.6 mtorr in the film deposition chamber in accordance with a radio-frequency magnetron sputtering method, and the thus deposited film was then transferred to the dehydrohalogenation chamber. Monochlorosilane was introduced into the dehydrohalogenation chamber, and the hydrogenated silicon film was exposed to ultraviolet rays from an ultraviolet lamp under a pressure of 0.1 torr for 30 seconds. The substrate having the film thereon was returned to the film deposition chamber, and the cyclic operation of the film deposition step and the dehydrohalogenation step was repeated 150 times under the same conditions to obtain a total thickness of about 6000 Å. Afterward, the substrate having the film was transferred to a second conductive film formation chamber, and the same operation as in Example 1 was carried out again.

The photovoltaic conversion properties of the thus obtained amorphous silicon solar cell were measured under the irradiation of AM-1.5 and 100 mW/cm$^2$ by means of a solar simulator. As a result, the photovoltaic conversion efficiency was 12.6%, short-circuit current was 18.29 mA/cm$^2$, open circuit voltage was 0.897V, and fill factor was 0.768, which meant that the solar cell had excellent performance. In addition, for the purpose of inspecting the light-stability of the above-mentioned amorphous solar cell, it was continuously irradiated with light of AM-1.5 and 100 mW/cm$^2$ for 20 hours to observe the change of the photovoltaic conversion efficiency. The decrease of the photovoltaic conversion efficiency after 20 hours with respect to the initial photovoltaic conversion efficiency was 2% or less, which meant that the above-mentioned amorphous silicon solar cell was excellent in stability.

COMPARATIVE EXAMPLE 5

Following the same procedure as in Example 7, a hydrogenated silicon film having a thickness of 6000 Å was formed, except without performing a dehydrohalogenation step after the film deposition, thereby preparing an amorphous silicon solar cell. With regard to the performance of the thus obtained amorphous silicon solar cell, the photovoltaic conversion efficiency was 10.7%, short-circuit current was 17.55 mA/cm$^2$, open circuit voltage was 0.885V, and fill factor was 0.689, which meant that the solar cell in this comparative example was poorer in performance than the cell in Example 7. Furthermore, the light-stability of the cell was measured, and as a result, the decrease of the photovoltaic conversion efficiency after light irradiation for 20 hours was about 27%, which meant that the stability was insufficient.

As is apparent from the above-mentioned examples and comparative examples, according to the present invention, a thicker second substantially intrinsic film is prepared by depositing in one deposition step a film having a thickness of at least 5 to 100 Å, and the thus deposited film is treated with a non-deposition, reactive gas in a modification step, the sequence of deposition and modification steps being repeated multiple times to prepare an amorphous silicon solar cell, and this cell has better photovoltaic characteristics as compared with an amorphous silicon solar cell prepared without subjecting the film to the modification step. Accordingly, in the solar cell of the present invention, stability to light irradiation and other characteristics of conventional cells can be remarkably improved. In consequence, the present invention can provide a technique which permits high conversion efficiency and high reliability required in solar cells for electric power, and thus it is an extremely useful invention in the energy industry.

What is claimed is:

1. A method for preparing an amorphous silicon solar cell in which there is formed on a substrate successively, a first electrode, a first conductive film, a thinner first substantially intrinsic film, a thicker second substantially intrinsic film, a second conductive film of a conductivity type different from that of the first conductive film, and a second electrode, which method comprises forming at least the thicker second substantially intrinsic film by the sequential steps of:
   (a) depositing a semiconductor film containing 20 atom % or less of bound hydrogen and/or bound deuterium, to a thickness of 10 to 1000 Å, and then
   (b) modifying the deposited film by exposing the film (i) to a discharge atmosphere containing a non-film-depositing reactive gas, (ii) to monovalent ions, or (iii) to atomic hydrogen or atomic deuterium and repeating the sequence of steps (a) and (b) multiple times whereby the thickness of the second substantially intrinsic film is thicker than the first substantially intrinsic film.

2. The method for preparing an amorphous silicon solar cell according to claim 1 wherein a thinner third substantially intrinsic film is further formed between the thicker second substantially intrinsic film and the second conductive film.

3. The method for preparing an amorphous silicon solar cell according to claim 1 wherein the semiconductor film thickness in the step (a) is from 10 to 100 Å.

4. The method for preparing an amorphous silicon solar cell according to claim 1 wherein the amount of bound hydrogen and/or bound deuterium in the semiconductor film in the step (a) is 10 atom % or less.

5. The method for preparing an amorphous silicon solar cell according to claim 1 wherein the modification step (b) is carried out by exposing the deposited film to a discharge atmosphere containing a non-film-depositing reactive gas.

6. The method for preparing an amorphous silicon solar cell according to claim 5 wherein the non-film-depositing reactive gas is at least one gas selected from the group consisting of hydrogen, deuterium, hydrogen fluoride, fluorine, nitrogen trifluoride, and carbon tetrafluoride.

7. The method for preparing an amorphous silicon solar cell according to claim 1 wherein the modification step (b) is carried out by exposing the deposited film to monovalent ions.

8. The method for preparing an amorphous silicon solar cell according to claim 1 wherein the modification step (b) is carried out by exposing the deposited film to atomic hydrogen or atomic deuterium.

9. The method for preparing an amorphous, silicon solar cell according to claim 1 wherein the final thickness of the thicker second substantially intrinsic film is from 500 Å to 2 μm.

10. The method for preparing an amorphous silicon solar cell according to claim 1 wherein the amount of bound hydrogen and/or bound deuterium in the obtained thicker second substantially intrinsic film is from 1 to 10 atom %.

11. An amorphous silicon solar cell formed by a method of claim 1.

12. A method for preparing an amorphous silicon solar cell in which there is formed on a substrate successively, a first electrode, a first conductive film, a thinner first substantially intrinsic film, a thicker second substantially intrinsic film, a second conductive film of a conductivity type different from that of the first conductive film, and a second electrode, which method comprises forming at least the thicker second substantially intrinsic film by the sequential steps of:
   (a) depositing to a thickness of from 10 to 100 Å, a semiconductor film containing halogen atoms as deposited or to which halogen atoms are thereafter added thereto by exposure to a halogen-containing reactive gas and then (b) modifying the deposited film by subjecting it to dehydrohalogenation, and repeating the sequence of steps (a) and (b) multiple times whereby the thickness of the second substantially intrinsic film is thicker than the first substantially intrinsic film.

13. The method for preparing an amorphous silicon solar cell according to claim 12 wherein a thinner third substantially intrinsic film is further formed between the thicker second substantially intrinsic film and the second conductive film.

14. The method for preparing an amorphous silicon solar cell according to claim 12 wherein the silicon semiconductor film is a halogenated silicon semiconductor film, and the step of the dehydrohalogenation is carried out by bringing the halogenated silicon semiconductor film into contact with a silicon hydride gas.

15. The method for preparing an amorphous silicon solar cell according to claim 14 wherein the dehydrohalogenation is carried out with the irradiation of light.

16. The method for preparing an amorphous silicon solar cell according to claim 12 wherein the silicon semiconductor film is a hydrogenated silicon semiconductor film, and the step of the dehydrohalogenation is carried out by bringing the hydrogenated silicon semiconductor film into contact with a silicon halide gas.

17. The method for preparing an amorphous silicon solar cell according to claim 16 wherein the dehydrohalogenation is achieved with the irradiation of light.

18. An amorphous silicon solar cell formed by a method of claim 12.

19. A method for preparing an amorphous silicon semiconductor film which comprises the sequential steps of:
(a) depositing on a substrate a semiconductor film containing 20 atom % or less of bound hydrogen and/or bound deuterium, to a thickness of from 10 to 1000 Å, and then (b) modifying the deposited film by exposing it to a discharge atmosphere containing deuterium and a non-film-depositing reactive gas, the sequence of steps being repeated multiple times.

20. The method for preparing an amorphous silicon semiconductor film according to claim 19 wherein the semiconductor film thickness in the step (a) is from 5 to 100 Å.

21. The method for preparing an amorphous silicon semiconductor film according to claim 19 wherein the amount of bound hydrogen and/or bound deuterium in the semiconductor film in the step (a) is 10 atom % or less.

22. The method for preparing an amorphous silicon semiconductor film according to claim 19 wherein the modification step (b) is carried out by exposing the formed film to monovalent ions including deuterium ions.

23. The method for preparing an amorphous silicon semiconductor film according to claim 19 wherein the modification step (b) is carried out by exposing the formed film to atomic hydrogen and atomic deuterium.

24. The method for preparing an amorphous silicon semiconductor film according to claim 19 wherein the non-film-depositing reactive gas contains at least one gas selected from the group consisting of hydrogen, hydrogen fluoride, fluorine, nitrogen trifluoride, and carbon tetrafluoride.

25. The method for preparing an amorphous silicon semiconductor film according to claim 19 wherein the thickness of the film obtained by repeating the steps (a) and (b) is from 1000 Å to 10 μm.

26. The method for preparing an amorphous silicon semiconductor film according to claim 19 wherein the amount of bound hydrogen and/or bound deuterium in the film obtained by repeating the steps (a) and (b) is from 1 to 10 atom %.

27. A semiconductor film formed by a method of claim 19.

* * * * *